United States Patent [19]

Tatah

[11] Patent Number: 5,567,336

[45] Date of Patent: Oct. 22, 1996

[54] LASER ABLATION FORWARD METAL DEPOSITION WITH ELECTROSTATIC ASSISTED BONDING

[75] Inventor: Abdelkrim Tatah, Arlington, Mass.

[73] Assignee: Matsushita Electric Industrial Co., Ltd., Osaka, Japan

[21] Appl. No.: 414,930

[22] Filed: Mar. 31, 1995

Related U.S. Application Data

[63] Continuation-in-part of Ser. No. 328,101, Oct. 24, 1994.

[51] Int. Cl.⁶ .................................................. B23K 26/00
[52] U.S. Cl. .......................... 219/121.66; 249/121.65; 249/121.74; 249/121.76; 249/121.85; 156/272.8; 156/273.1; 427/469; 427/555; 427/597
[58] Field of Search .................. 219/121.77, 121.6, 219/121.61, 121.63, 121.64, 121.66, 121.65, 121.68, 121.69, 121.74, 121.85, 121.76; 427/458, 466, 469, 554, 555, 596, 597; 437/123; 148/524, 525; 29/846, 850; 156/272.8, 273.1, 273.9

[56] References Cited

U.S. PATENT DOCUMENTS

| | | | |
|---|---|---|---|
| 3,560,258 | 2/1971 | Brisbane | 219/121.63 |
| 3,757,078 | 9/1973 | Conti et al. | 219/121.74 |
| 3,781,978 | 1/1974 | Intrator et al. | 437/171 |
| 4,294,602 | 10/1981 | Horne | 65/40 |
| 4,349,583 | 9/1982 | Kulynych et al. | |
| 4,622,058 | 11/1986 | Leary-Renick et al. | |
| 4,752,455 | 6/1988 | Mayer | 427/597 |
| 4,879,450 | 11/1989 | Valentin et al. | 219/121.66 |
| 4,895,735 | 1/1990 | Cook | 427/597 |
| 4,933,204 | 6/1990 | Warren, Jr. et al. | |
| 4,987,006 | 1/1991 | Williams et al. | 427/597 |
| 5,057,184 | 10/1991 | Gupta et al. | |
| 5,079,070 | 1/1992 | Chalco et al. | |
| 5,141,602 | 8/1992 | Chen et al. | |
| 5,153,408 | 10/1992 | Handford et al. | |
| 5,175,504 | 12/1992 | Henley | |
| 5,177,594 | 1/1993 | Chance et al. | |
| 5,203,929 | 4/1993 | Takayanagi et al. | 148/525 |
| 5,235,272 | 8/1993 | Henley | |
| 5,246,745 | 9/1993 | Baum et al. | |
| 5,481,082 | 2/1996 | Yamamoto | 219/121.63 |
| 5,495,089 | 2/1996 | Freedman et al. | 219/121.64 |

*Primary Examiner*—Teresa J. Walberg
*Assistant Examiner*—Gregory L. Mills
*Attorney, Agent, or Firm*—Ratner & Prestia

[57] ABSTRACT

Apparatus and method for metal line deposition on a substrate. Laser ablation of a metal film coated on a first substrate removes metal ions from the film. The ions travel forward to a surface of a second substrate disposed opposite the metal film on the first substrate and are deposited on the second substrate. A positive electrode on the first substrate, a negative electrode on the second substrate, and a power supply create an electric field that is simultaneously applied across the first and second substrates to bond the metal ions to the second substrate. Bonding is enhanced by repeated reflecting a laser beam through the second substrate to heat the second substrate. The laser beam is reflected between a reflector and the deposited metal line.

4 Claims, 4 Drawing Sheets

LASER ABLATION FORWARD METAL DEPOSITION WITH ELECTROSTATIC ASSISTED BONDING

RELATED APPLICATIONS

This application is a continuation-in-part of pending U.S. application Ser. No. 08/328,101, filed Oct. 24, 1994, by A. Tatah, and assigned to Panasonic Technologies, Inc.

FIELD OF THE INVENTION

This invention relates to metal line deposition and, more particularly, to laser ablation forward metal line deposition with electrostatic and heat assisted bonding of the metal ions to the substrate.

BACKGROUND OF THE INVENTION

Metal lines are commonly used for connecting circuits in personal computer boards and multichip modules. Existing metal line deposition techniques include laser chemical vapor deposition and laser deposition from metal precursors. These techniques have certain disadvantages associated with them, however. Chemical vapor deposition processes require toxic gases and a vacuum chamber. Deposition from metal precursors requires wet processing that can damage or introduce defects in the surrounding circuitry.

A less expensive and more environmentally friendly metal deposition technique is laser ablation. Laser ablation of metal films in general is a widely known technique wherein a laser beam is focused onto the metal film. The heat and shock wave generated by the laser beam remove, or discharge, particles of the film. Thin films of metals such as copper and gold may be easily removed, or ablated, using green light lasers, such as Q-switched doubled Nd:YAG, Nd:YLF, or copper vapor lasers.

One such laser ablation technique involves the use of pulsed-laser deposition in order to layer complex thin films on substrates. Using this technique, a focused laser beam is directed onto a target film at an angle. The plume of particles that are ablated from the film land on a substrate that is positioned parallel to the target. The particles are thus deposited onto the substrate to form a thin epitaxial coating. Both the substrate and the target are contained in a vacuum environment in this technique. This technique is useful for coating wide surfaces but not localized conductive metal lines.

SUMMARY OF THE INVENTION

This invention provides a method of depositing metal lines by disposing a first substrate having a metal coating on its surface in spaced relation to a second substrate such that the second substrate is adjacent the side of the first substrate having the metal coating. The metal coating is ablated to discharge ions of the metal coating. An electric field is applied across the first and second substrates to drive the ions to the second substrate and to electrostatically bond the metal ions to the second substrate. A reflector is provided to repeatedly reflect a laser beam through the second substrate between the reflector and the deposited metal line. This heats the second substrate and thereby enhances bonding of the metal ions to the second substrate.

In another aspect, the present invention provides apparatus for metal line deposition. A first substrate has a metal coating on its surface, and a laser is used to ablate the metal coating to discharge metal ions. A second substrate, onto which the metal line is to be deposited, is disposed in spaced relation adjacent the surface of the first substrate having the metal coating. An electric field is applied across the first and second substrates to drive the metal ions toward the second substrate and to electrostatically bond the ions to the second substrate. Bonding of the metal ions to the second substrate is enhanced by heating the second substrate by repeatedly reflecting a laser beam through the second substrate between a reflector and the deposited metal line.

DETAILED DESCRIPTION OF THE INVENTION

In this invention, laser ablation is used to deposit metal lines on substrates by the ablation of a metal film in a dry process that does not require a vacuum. In combination with the laser ablation, an electric field is applied across the substrate being ablated and the substrate onto which the metal lines are deposited to drive the ablated metal ions toward the deposition location and to electrostatically bond the metal ions to the surface of the deposition substrate.

Figure 1:
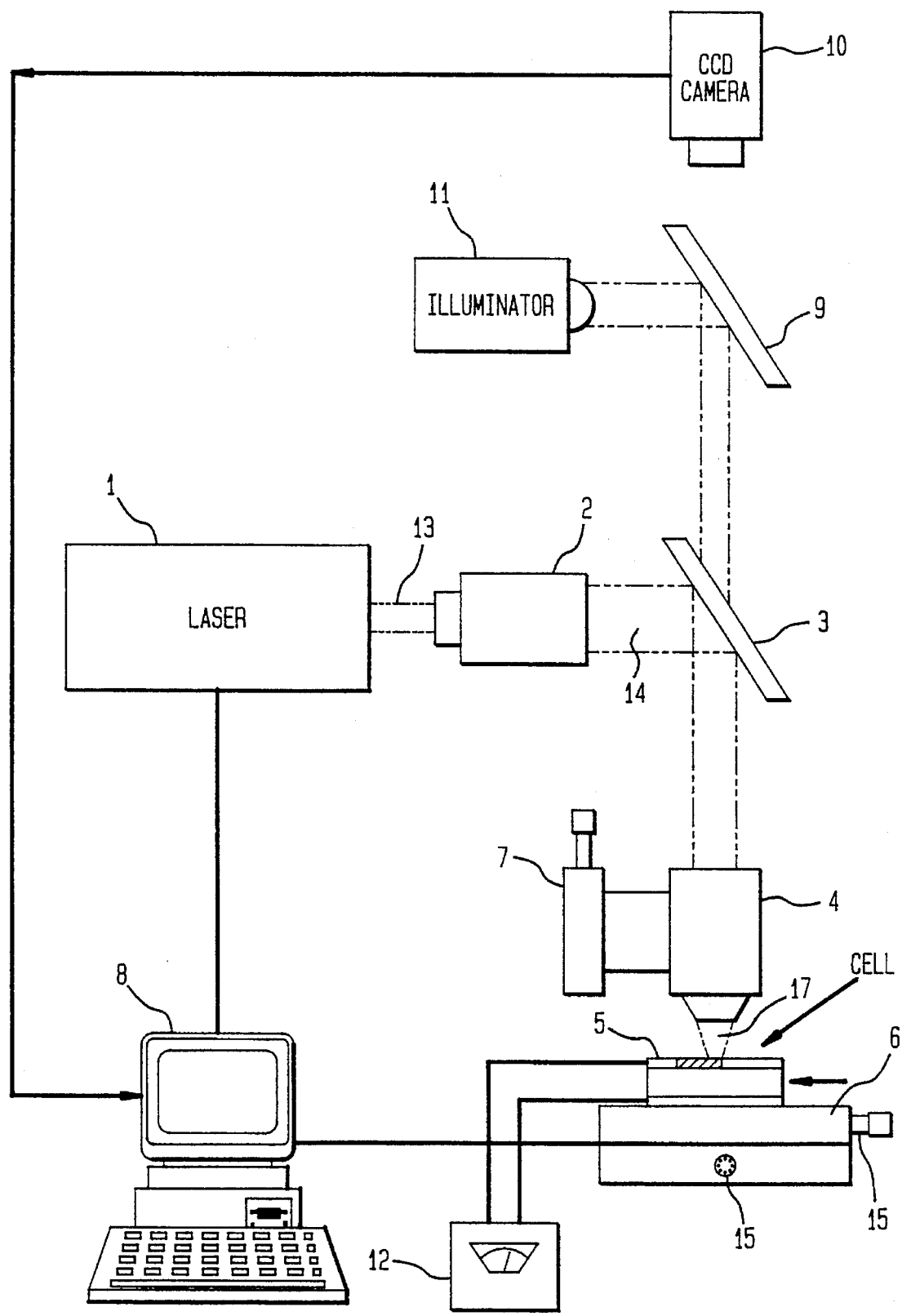
FIG. 1 is a side plan view of laser metal deposition apparatus including an exemplary embodiment of the present invention.

FIG. 1 illustrates a laser metal deposition apparatus including an exemplary embodiment of the present invention. Laser 1 in this exemplary embodiment is a harmonically doubled solid state Q-switched Nd:YLF or Nd:YAG laser, available from Continuum Inc., in Santa Clara, Calif. Laser beam 13 from laser 1 is expanded by telescope 2 into expanded beam 14. Beam 14 shines on dichroic mirror 3 which directs beam 14 into objective lens 4. Objective lens 4 focuses the beam to a diffraction limit spot on sample 5.

In the exemplary embodiment shown in FIG. 1, illuminator 11 provides light that is deflected by mirror 9 onto dichroic mirror 3. Illuminator 11 is used as a white light source to illuminate sample 5 so that the process and location of the focused spot can be monitored. A suitable illuminator is available from Edmund Scientific Company in Barrington, N.J.

Also, in the exemplary embodiment, CCD camera 10 is used to image and monitor the process location. The image is fed to computer 8 which computes subsequent process locations based on a programmed path. Any state of the art video camera is suitable for this purpose.

Sample 5 is supported on stage 6. Stage 6 is equipped with X-Y motion controls 15 that are controlled by computer 8. Suitable motion controls and computer are available from New England Affiliated Technologies in Lawrence, Mass., and comprise, for example, an XY-8080 precision stage, a PCX2 controller, and a 202M microstepping drive, with the controller interfaced to a 486 IBM PC or compatible.

Computer 8 also controls the power of laser 1. By adjusting the position of stage 6 and the power of laser 1, computer 8 enables the deposition of specific patterns on sample 5.

Figure 2:
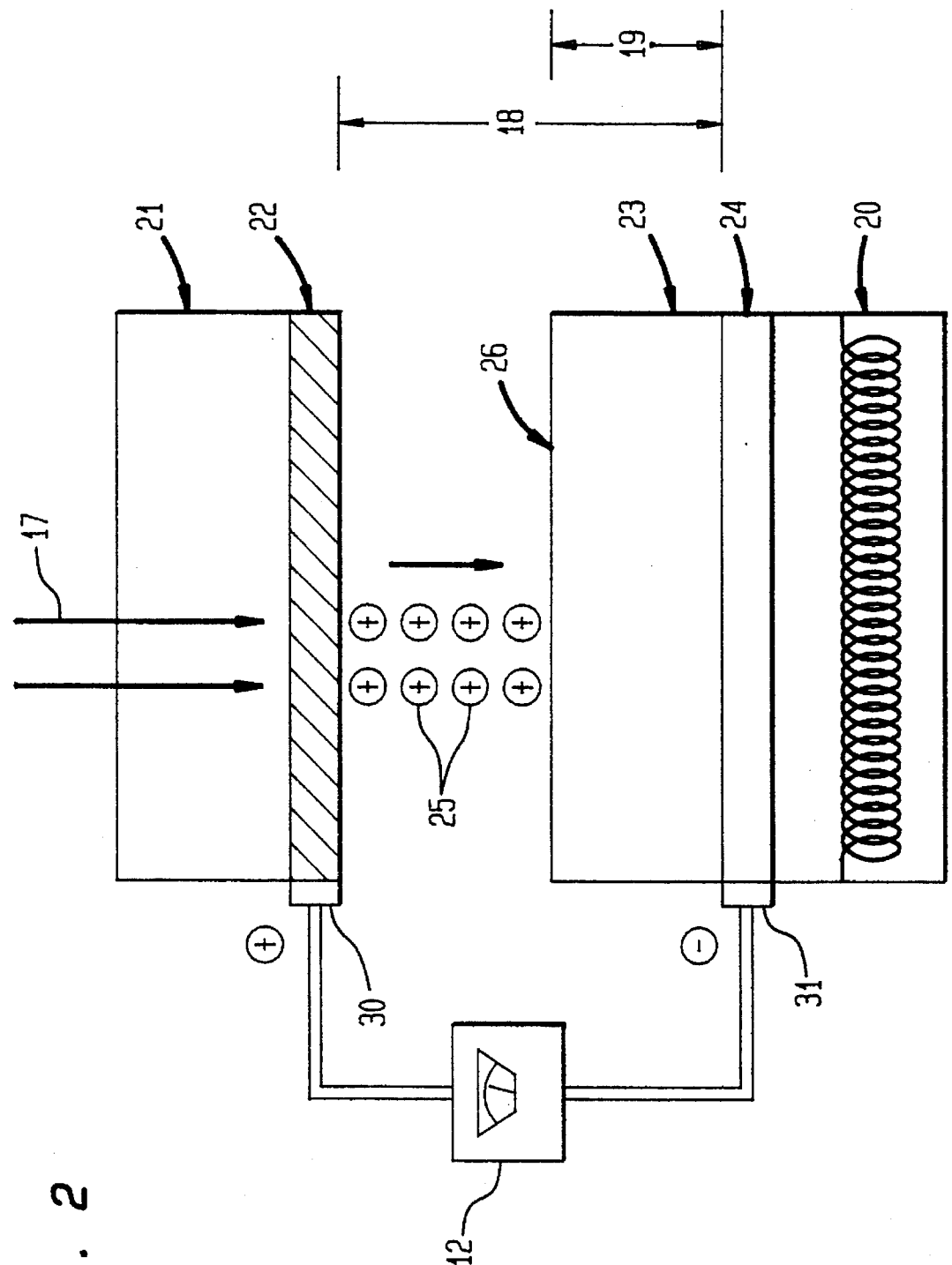
FIG. 2 is a side plan view of an exemplary unit cell for metal deposition and bonding according to the present invention.

Deposition of metal lines onto a substrate is illustrated in FIG. 2. A first substrate 21, which is glass in the exemplary embodiment, is disposed in the path of focused laser beam 17. Glass substrate 21 has metal coating 22 disposed on the side of glass substrate 21 furthest from objective lens 4. Coating 22 may be deposited by standard sputtering deposition or metal plating. Beam 17 passes through glass substrate 21 and impinges on metal coating 22 from the back side; that is, at the surface interface of metal coating 22 and glass substrate 21. The contact of laser 17 with metal coating 22 results in ablation of metal coating 22. During ablation, metal ions 25 accelerate away from metal coating 22.

Second substrate 23, which is also glass in the exemplary embodiment, is disposed adjacent the side of first glass substrate 21 having metal coating 22 thereon. As metal ions 25 accelerate from glass substrate 21 as a result of the ablation caused by focused laser beam 17, metal ions 25 contact second glass substrate 23.

An electric field is applied across first glass substrate 21 and second glass substrate 23 using power supply 12. Power supply 12 is used to create the electric field in this embodiment. Power supply 12 has a positive electrode 30 attached to the initiated metallic line to insure a permanent chemical seal as discussed below. A negative electrode 31 is connected to second glass substrate 23. In the exemplary embodiment of the invention, the voltages applied across the electrodes are at least 300 volts.

The electric field drives positively charged metal ions 25 toward second glass substrate 23. The transfer of metal ions 25 from metal film 22 to surface 26 is due to the electrostatic force and laser ablation-generated acoustic shock waves.

The electric field applied across first glass substrate 21 and second glass substrate 23 also assists the bonding of metal ions 25 to second glass substrate 23. Because of the contact of the negative electrode with second glass substrate 23, the positive ions such as sodium ions in glass substrate 23 migrate away from surface 26 toward the negative electrode. This leaves behind negative ions such as oxygen in the glass substrate 23. These negative ions electrostatically bond with the positive metal ions that contact surface 26. A permanent chemical seal due to a thin metal oxide layer is formed after the electric field is removed. Conducting metal lines can thus be formed on surface 26 of second substrate 23 from metal ions 25.

A hot plate 20 may be used to augment the migration of positive ions within second glass substrate 23 to the negative electrode and thus enhance the bonding of metal ions 25 to surface 26 of second glass substrate 23. The heat increases the diffusion and allows for greater mobility of the ions in the glass.

Figure 3:
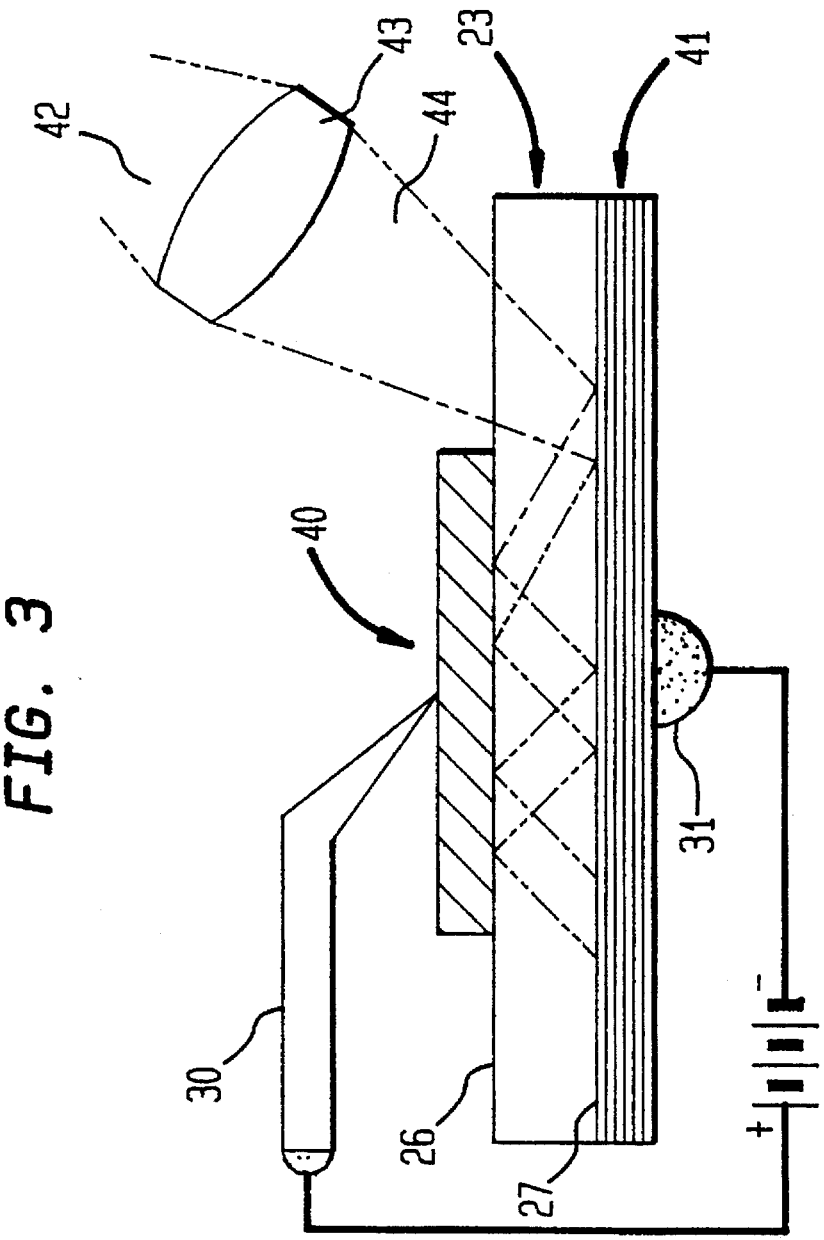
FIG. 3 is a side plan view of an exemplary heating system according to the present invention.

FIG. 3 shows an exemplary alternative system and method for heating second glass substrate 23. In the exemplary embodiment of FIG. 3, second glass substrate 23 is heated after a metal line 40 has been deposited. The system and method of FIG. 3 also apply, however, to heating second glass substrate 23 during deposition of metal line 40.

In FIG. 3, metallic line 40 has been deposited on surface 26 of second glass substrate 23. In the exemplary embodiment shown, metal line 40 is aluminum. It may typically be silver or other metals known to be suitable for use as metal line electrical connectors.

Second glass substrate 23 rests on a surface 27 opposing surface 26 on a metallic high reflector 41. Metallic high reflector 41 is thus adjacent surface 27 and opposes metal line 40. Metallic high reflector 41 may be any reflecting metal surface. In the exemplary embodiment shown, metallic high reflector 41 is aluminum.

To heat second glass substrate 23, a laser diode array beam 42 is focused on a lens 43. The laser diode array (not shown) used to generate laser diode array beam 42 may be any laser diode array known in the art. An exemplary laser diode array is Opto Power Corp.'s Model #OPC-A020-mmm-cs (approximately 1 cm wide, with an emitter to emitter distance of 400 microns and an emitter aperture size of 200×1 microns). The laser diode array in this embodiment is a separate laser source from laser 1. Laser diode array beam 42 in the exemplary embodiment is near infrared light.

Lens 43 focuses laser diode array beam 42 into a focused beam 44. Focused beam 44 is directed through second glass substrate 23 onto metallic high reflector 41. Metallic high reflector 41 reflects focused beam 44 back up through second glass substrate to metal line 40. Metal line 40 reflects focused beam 44 back down through second glass substrate 23 to metallic high reflector 41, which again reflects focused beam 44 back up, and so on. Focused beam 44 thus experiences several reflections between metal line 40 and metallic high reflector 41. Metal line 40 and metallic high reflector 41 act as a waveguide for focused beam 44.

As focused beam 44 is repeatedly reflected through second glass substrate 23, second glass substrate 23 absorbs some of the light, and hence some of the energy, of focused beam 44. This absoption of energy heats second glass substrate 23, which enhances the electrostatic bonding of metal ions 25 in metal line 40 to surface 26 of second glass substrate 23. In the exemplary embodiment, second glass substrate 23 is heated to 300° C.

Figure 4A:
FIGS. 4(a) and 4(b) are cross-sectional microscopic images of samples produced using the present invention.
Figure 4B:

FIGS. 4(a) and (b) are cross-sectional microscopic images of the interface 50 between metal line 40 and second glass substrate 23 in a sample produced using the present invention. FIG. 4(a) is a difference interference contrast microscope image showing that metal line 40 is bonded to surface 26 of second glass substrate 23. FIG. 4(b) is a dark field optical microscope image showing that metal line 40 is bonded to surface 26 of second glass substrate 23.

A manual pull test performed on a sample metal line deposited according to the present invention, using the heating system described in connection with FIG. 3, showed considerable strength of bonding between the metal line and the second glass substrate. The manual pull test showed that metal line deposited using the present invention was bonded much more strongly to the substrate than metal line deposited using conventional techniques.

In the exemplary embodiment depicted in FIG. 3, an electric field is applied across second glass substrate 23. The electric field acts in conjunction with the heating of second glass substrate 23 to improve the bonding of metal line 40 to second glass substrate 23. In FIG. 3, positive electrode 30 is connected to metal line 40, and negative electrode 31 is connected to metallic reflector 41. Positive ions within second glass substrate 23 migrate toward negative electrode 31, leaving negative ions to bond electrostatically with the positive ions in metal line 40.

When the heating system shown in FIG. 3 is used during deposition of metal line 40, positive electrode 30 remains connected to metallic coating 22 of first glass substrate 21 as shown in FIG. 2. Metallic high reflector 41 is inserted under second glass substrate 23 in FIG. 2. Focused beam 44 is then directed through second glass substrate 23 onto metallic high reflector 41 and then repeatedly reflected, as described above in connection with FIG. 3, between high reflector 41 and metal line 40 as metal line 40 is deposited.

Localized heating of laser diode array beam is beneficial because heat is concentrated where needed by natural reflection properties of deposited metal. The substrate beneath the line can be heated to a higher temperature without damaging other components as may occur if a hot plate is used. Heating of substrate increases the mobility of ions, enhancing chemical reactions that bond metal to substrate. Heating may also allow the deposited metal to flow into defects in the substrate, improving the bond. In addition, heating according to the exemplary embodiment described above may provide a form of localized annealing of the metal lines, which may minimize grain boundaries or dislocations in the metallic structure to provide a more homogeneous line.

Returning to FIG. 2, by adjusting stage controls 15 and the power of laser 1, computer 8 enables movement of stage 6, and hence sample 5, under beam 17. This allows metal line patterns to be written on sample 5. Alternatively, the beam can be moved with a scanner and a scanning lens with the sample held stationary under the beam.

The spacing 18 between the first glass substrate 21 and the second glass substrate 23 may be adjusted to vary the feature size (width) of the resulting metal lines on second substrate 23. As the substrates 21 and 23 are moved further apart to increase spacing 18, the feature size of the lines increases.

The thickness of metal coating 22 may be varied in order to change the thickness of the metal lines on second substrate 23. Having a thicker metal coating 22 on substrate 21 allows more metal ions 25 to be ablated. This produces a thicker metal line.

The strength of the bonding between metal ions 25 and second glass substrate 23 is improved by heating second glass substrate 23 (either during or after metal line deposition), by applying an electric field across first glass substrate 21 and second glass substrate 23, and also by increasing the intensity of laser beam 13.

When used for imaging, such as in the preparation of a lithography mask, laser ablation forward metal deposition with electrostatic assisted bonding according to the present invention may form two metal masks simultaneously. When metal coating 22 is ablated completely, thereby exposing the surface of substrate 21, a mask having a positive image is formed. At the same time, a complementary mask is formed on second substrate 23 having a negative image.

The positive and negative masks formed according to this embodiment of the present invention may be used on the photoresists used in lithography. Both positive and negative photoresists are used. The positive mask may be used on positive photoresist, and the negative mask on the negative photoresist.

Although this invention has been described with reference to a particular embodiment, it is not intended to be limited thereto. Rather, the scope of the invention is intended to be interpreted according to the scope of the appended claims.

What is claimed:

1. A method of bonding a metal line to a substrate having the metal line on a first surface thereof, and a second surface opposing the first surface, comprising the steps of:

(a) disposing said second surface adjacent a reflector such that said reflector directly opposes said metal line;

(b) applying an electric field across said substrate; and (c) focusing a laser beam through said substrate onto said reflector such that said laser beam is repeatedly reflected between said reflector and said metal line;

whereby said substrate absorbs energy from said laser beam as said laser beam is repeatedly reflected through said substrate, thereby heating said substrate.

2. A method of depositing a metal line comprising the steps of:

(a) disposing a first substrate having a metal coating on a surface thereof in spaced relation to a second substrate such that said second substrate is adjacent the surface of said first substrate having the metal coating;

(b) ablating said metal coating to discharge ions of said metal coating;

(c) applying an electric field across said first and second substrates to drive said ions to said second substrate and to bond said ions thereto; and (d) heating said second substrate by repeatedly reflecting a laser beam through said second substrate to enhance bonding of said ions thereto.

3. Apparatus for bonding a metal line to a substrate having the metal line on a first surface thereof, and a second surface opposing the first surface, comprising:

(a) a reflector disposed adjacent to said second surface such that said reflector directly opposes said metal line;

(b) means for applying an electric field across said substrate; and (c) means for focusing a laser beam through said substrate onto said reflector such that said laser beam is repeatedly reflected between said reflector and said metal line;

whereby said substrate absorbs energy from said laser beam as said laser beam is repeatedly reflected through said substrate, thereby heating said substrate.

4. Apparatus for depositing a metal line comprising:

(a) a first substrate having a metal coating on a surface thereof;

(b) means for ablating said metal coating to discharge metal ions;

(c) a second substrate, onto which said metal line is to be deposited, disposed in spaced relation adjacent to said surface of said first substrate having the metal coating thereon;

(d) means for applying an electric field across said first and second substrates to drive said metal ions toward said second substrate and bond said ions thereto; and (e) means for repeatedly reflecting a laser beam through said second substrate to heat said second substrate and thereby enhance bonding of said ions thereto.

* * * * *